United States Patent
Mao et al.

(10) Patent No.: US 11,133,239 B2
(45) Date of Patent: Sep. 28, 2021

(54) MECHANICAL PART FOR FASTENING PROCESSOR, ASSEMBLY, AND COMPUTER DEVICE

(71) Applicant: Huawei Technologies Co., Ltd., Shenzhen (CN)

(72) Inventors: Yonghai Mao, Shenzhen (CN); Yong Yao, Kanagawa (JP); Guangyu Fang, Shenzhen (CN); Dingfang Li, Dongguan (CN); Shan Lin, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/719,030

(22) Filed: Dec. 18, 2019

(65) Prior Publication Data

US 2020/0126889 A1   Apr. 23, 2020

Related U.S. Application Data

(63) Continuation of application No. PCT/CN2018/079161, filed on Mar. 15, 2018.

(30) Foreign Application Priority Data

Jul. 5, 2017   (CN) .......................... 201710543641.5

(51) Int. Cl.
*H01L 23/40* (2006.01)
*G06F 1/18* (2006.01)
*G06F 1/20* (2006.01)

(52) U.S. Cl.
CPC .......... *H01L 23/4006* (2013.01); *G06F 1/183* (2013.01); *G06F 1/20* (2013.01); *H01L 2023/405* (2013.01); *H01L 2023/4062* (2013.01); *H01L 2023/4081* (2013.01); *H01L 2023/4087* (2013.01)

(58) Field of Classification Search
CPC ................ H01L 23/40–4012; H01L 2023/405
See application file for complete search history.

(56) References Cited

U.S. PATENT DOCUMENTS

| | | | | |
|---|---|---|---|---|
| 5,757,621 A | * | 5/1998 | Patel | H01L 23/4006 257/719 |
| 5,901,039 A | * | 5/1999 | Dehaine | H01L 23/4006 361/704 |
| 6,480,387 B1 | * | 11/2002 | Lee | H01L 23/4006 165/80.3 |

(Continued)

FOREIGN PATENT DOCUMENTS

| | | |
|---|---|---|
| CN | 1618127 A | 5/2005 |
| CN | 1758181 A | 4/2006 |

(Continued)

*Primary Examiner* — Robert J Hoffberg
(74) *Attorney, Agent, or Firm* — Conley Rose, P.C.

(57) ABSTRACT

In a processor fastening structure, when a compression spring (23) is compressed by shortening a distance between the other end of a screw (24) and a heat sink base (22), the compression spring (23) provides elastic force for both the screw (24) and the heat sink base (22). In addition, because the screw (24) passes through the compression spring (23) to connect to a fastening assembly (21), the elastic force of the compression spring (23) is converted into pressure from the heat sink base (22) to a CPU.

20 Claims, 10 Drawing Sheets

(56) References Cited

U.S. PATENT DOCUMENTS

| | | | |
|---|---|---|---|
| 6,545,879 B1 | 4/2003 | Goodwin | |
| 6,549,410 B1* | 4/2003 | Cohen | H01L 23/4006 165/185 |
| 6,611,431 B1* | 8/2003 | Lee | H01L 23/4006 257/719 |
| 7,193,853 B2* | 3/2007 | Chen | H01L 23/4006 165/80.3 |
| 7,342,791 B2* | 3/2008 | Lee | H01L 23/4006 165/185 |
| 7,342,795 B2* | 3/2008 | Lee | H01L 23/4006 165/185 |
| 7,342,796 B2* | 3/2008 | Aukzemas | F16B 37/145 165/185 |
| 7,474,530 B2* | 1/2009 | Stewart | H01L 23/4006 165/104.33 |
| 7,583,504 B2* | 9/2009 | Aberg | H01L 23/4006 165/80.3 |
| 7,609,522 B2* | 10/2009 | Jin | H01L 23/4006 165/80.2 |
| 7,667,970 B2* | 2/2010 | Ma | H01L 23/4006 361/704 |
| 7,796,390 B1* | 9/2010 | Cao | F28D 15/0275 361/704 |
| 8,526,185 B2* | 9/2013 | Heidepriem | G06F 1/20 361/712 |
| 8,794,889 B2* | 8/2014 | Aukzemas | F16B 31/04 411/353 |
| 9,521,757 B2* | 12/2016 | Kyle | H05K 1/0204 |
| 10,103,086 B2* | 10/2018 | Lin | H01L 23/4093 |
| 10,861,771 B2* | 12/2020 | Wu | H01L 23/32 |
| 10,882,147 B2* | 1/2021 | Potter | G06F 1/203 |
| 2006/0120060 A1 | 6/2006 | Boudreaux et al. | |
| 2006/0245165 A1 | 11/2006 | Lin | |
| 2007/0025086 A1 | 2/2007 | Huang et al. | |
| 2008/0117598 A1* | 5/2008 | Hsu | H01L 23/4006 361/704 |
| 2008/0310118 A1* | 12/2008 | Brocklesby | H01L 21/50 361/719 |
| 2009/0168365 A1 | 7/2009 | Hsieh et al. | |
| 2010/0226102 A1 | 9/2010 | So et al. | |
| 2012/0092826 A1 | 4/2012 | Heidepriem et al. | |
| 2013/0208427 A1* | 8/2013 | Lin | H01L 23/40 361/720 |
| 2013/0314877 A1* | 11/2013 | Watanabe | H05K 1/0203 361/719 |
| 2016/0205784 A1* | 7/2016 | Kyle | H05K 3/301 361/679.02 |
| 2017/0034952 A1 | 2/2017 | Veh et al. | |
| 2019/0115282 A1* | 4/2019 | Wu | H01L 23/4006 |
| 2020/0126889 A1 | 4/2020 | Mao et al. | |
| 2020/0328135 A1* | 10/2020 | Terhune, IV | H01L 23/4006 |
| 2020/0335432 A1* | 10/2020 | Murtagian | H01L 23/4006 |

FOREIGN PATENT DOCUMENTS

| | | | |
|---|---|---|---|
| CN | 101472440 A | | 7/2009 |
| CN | 201569963 U | | 9/2010 |
| CN | 201654655 U | | 11/2010 |
| CN | 102438432 A | | 5/2012 |
| CN | 202738355 U | | 2/2013 |
| CN | 103488258 A | | 1/2014 |
| CN | 204425856 U | | 6/2015 |
| CN | 105826620 A | | 8/2016 |
| CN | 205596496 U | | 9/2016 |
| CN | 106684059 A | | 5/2017 |
| CN | 107577285 A | | 1/2018 |
| CN | 112000531 A | * | 11/2020 |
| JP | 2010205919 A | | 9/2010 |
| KR | 20060107046 A | | 10/2006 |
| WO | 03071602 A1 | | 8/2003 |
| WO | 2007055625 A1 | | 5/2007 |
| WO | 2016048384 A1 | | 3/2016 |

* cited by examiner

MECHANICAL PART FOR FASTENING PROCESSOR, ASSEMBLY, AND COMPUTER DEVICE

CROSS-REFERENCE TO RELATED APPLICATIONS

This is a continuation of Int'l Patent App. No. PCT/CN2018/079161 filed on Mar. 15, 2018, which claims priority to Chinese Patent App. No. 201710543641.5 filed on Jul. 5, 2017, which are incorporated by reference.

TECHNICAL FIELD

This application relates to the field of computer technologies, and specifically, to a mechanical part for fastening a processor, an assembly, and a computer device.

BACKGROUND

In the era of the Internet, big data, and cloud computing, higher requirements are raised for all of transmission and processing speeds, a storage capability, and a high-performance computing capability for massive data. Due to impact caused by intensive computing, a higher requirement is raised for a processing capability of a server.

In an existing manner, an area of a single processor is increased, and an increasing quantity of more complex circuits are integrated into the processor whose area is increased, to improve a processing capability of the single processor. For example, for a central processing unit (CPU) product of an Intel server, a quantity of pins is increased from 2011 to 3647, and as a result, the area of the single processor increases by approximately 80%. However, an area occupied by the processor is almost constant on a printed circuit board (PCB). Therefore, a total pressure load of the CPU greatly increases, and a retention force provided between the CPU and a processor slot is also transferred from a lining board to a heat sink assembly.

However, with a combination of a heat sink and an existing processor fastening structure, it is difficult to meet a requirement for the increased total pressure load of the CPU whose area is increased, and consequently, bonding between the heat sink and the CPU is not tight enough. An adequate heat dissipation capability may fail to be maintained, and it is difficult to ensure contact reliability between the CPU and the processor slot.

SUMMARY

Embodiments of this application provide a mechanical part for fastening a processor, an assembly, and a computer device. A fastening assembly and a heat sink base that are fastened on a PCB are redesigned to improve a total pressure load of a CPU, so that bonding between a heat sink and the CPU is tighter, thereby ensuring enduring heat dissipation performance and contact reliability between the CPU and a processor slot.

A first aspect of the embodiments of this application provides a processor fastening structure, where the processor fastening structure includes a heat sink base that is in contact with a processor, the heat sink base is fastened on a fastening assembly located in a processor slot on a printed circuit board PCB, an elastic mechanical part and a limiting mechanical part configured to limit the elastic mechanical part to a position are disposed on a side of the heat sink base, one end of the limiting mechanical part passes through the elastic mechanical part to connect to the fastening assembly, and the elastic mechanical part is located between the other end of the limiting mechanical part and the heat sink base.

It can be learned that the elastic mechanical part is disposed on the heat sink base, the limiting mechanical part is disposed on the elastic mechanical part, one end of the limiting mechanical part passes through the elastic mechanical part to connect to the fastening assembly, and the elastic mechanical part is located between the other end of the limiting mechanical part and the heat sink base. Therefore, the elastic mechanical part can be compressed by shortening a distance between the other end of the limiting mechanical part and the heat sink base. When the elastic mechanical part is compressed by using the limiting mechanical part, the elastic mechanical part provides elastic force for both the limiting mechanical part and the heat sink base. In addition, because the limiting mechanical part passes through the elastic mechanical part to connect to the fastening assembly, the elastic force of the elastic mechanical part is converted into pressure from the heat sink base to a CPU. In this way, pressure on the CPU can be increased to meet an increased total pressure load.

In some embodiments, the elastic mechanical part includes a compression spring or a spring plate. Regardless of the spring plate or the compression spring, the spring plate or the compression spring can be compressed by shortening the distance between the other end of the limiting mechanical part and the heat sink base. In this way, implementability of the processor fastening structure in this application can be enhanced.

In some embodiments, the elastic mechanical part is a compression spring, the limiting mechanical part is a first screw, the compression spring is sheathed over the first screw, a diameter of a head end of the first screw is greater than an inner diameter of an end part of the compression spring, and two ends of the compression spring are located between the head end of the first screw and the heat sink base. In this case, because the diameter of the head end of the first screw is greater than the inner diameter of the compression spring, the first screw may be tightened to shorten a distance between the head end of the first screw and the heat sink base, to achieve a purpose of compressing the compression spring, so that elastic force generated by the compression spring has an action on the heat sink base. In this manner, implementability of the processor fastening structure in this application can be enhanced.

In some embodiments, a first limiting hole is provided on the heat sink base, a tail end of the first screw passes through the first limiting hole to connect to the fastening assembly, a first limiting washer is further disposed at the tail end of the first screw, the heat sink base is located between the first limiting washer and the compression spring, and an outer diameter of the first limiting washer is greater than an diameter of the first limiting hole. In this structure, the heat sink base is located between the first limiting washer and the compression spring, and because the outer diameter of the first limiting washer is greater than the diameter of the first limiting hole, the first limiting washer can lock the first screw to the heat sink base, so that the first screw does not fall from the heat sink base. In this way, scalability of the processor fastening structure in this application can be enhanced.

In some embodiments, the first limiting washer is clamped to the tail end of the first screw. In other words, the first limiting washer is connected to the first screw in a clamping manner. In this manner, the first limiting washer is detachably connected to the first screw, and when in use, the first screw is inserted into the first limiting hole and then the first limiting washer is mounted at the tail end. In this way, implementability of the processor fastening structure in this application can be enhanced.

In some embodiments, when the first limiting washer is in contact with the heat sink base, to be specific, a distance between the head end of the first screw and the heat sink base reaches a maximum value, in this case, a free height of the compression spring is less than the distance between the head end of the first screw and the heat sink base. In this disposition, the compression spring is not pre-compressed, and a specific gap is reserved between the compression spring in a free state and the heat sink base or the head end of the first screw. Therefore, mounting inconvenience caused in the following case can be resolved: during mounting, when one side of the heat sink base is mounted onto the fastening assembly, the other side tilts upwards, and the other side of the heat sink base cannot be manually pressed down.

In some embodiments, a first groove is further provided on a surface that is of the heat sink base and that is opposite the first limiting washer, and when the first limiting washer is in contact with the heat sink base, to be specific, the distance between the head end of the first screw and the heat sink base reaches a maximum value, the first limiting washer is located in the first groove. In this design, larger motion space can be provided for the first screw, so that a compression spring of a higher free height can be sheathed over the first screw to meet different pressure load requirements; and because the first limiting washer is located in the first groove, when the heat sink base is mounted, the first limiting washer does not press against the fastening assembly, and the mounting can be facilitated.

In some embodiments, because an end part of the compression spring is in contact with the heat sink base, and a contact area between the end part and the heat sink base is limited, pressure on the heat sink base is likely unbalanced. In this case, a washer is further disposed over the first screw and between the heat sink base and the compression spring. The washer can increase the contact area between the compression spring and the heat sink base, and can prevent direct contact between the end part of the compression spring and the heat sink base. Because the heat sink base is generally made of relatively soft material such as aluminum alloy or copper, and the end part of the compression spring is relatively sharp, metal filings easily peel off from the material. The washer may be a steel sheet made of stainless steel, and therefore can effectively resolve this problem.

In some embodiments, there are more than two compression springs and more than two first screws, and the more than two compression springs are symmetrically distributed on two sides of the heat sink base. Because the processor is generally a regular structure and when a heat sink structure is mounted, pressure from the heat sink base to each contact part of the processor needs to be even, bonding between the processor and the heat sink base is tighter, and stress on the PCB board can be reduced.

In some embodiments, the processor fastening structure further includes the fastening assembly, inner threads are provided at the tail end of the first screw, a second screw corresponding to the first screw is disposed on the fastening assembly, and outer threads of the second screw fit the inner threads disposed at the tail end of the first screw. To facilitate position limiting in the first limiting hole and facilitate mounting of the first limiting washer, the first screw provides the inner threads at the tail end and an entire side face of the first screw may be a smooth cylindrical surface. In addition, because of this design manner of the first screw, the second screw is a second screw that provides the outer threads and that fits the first screw, and the second screw is fastened on the fastening assembly. In this way, implementability of the processor fastening structure in this application can be enhanced.

In some embodiments, the limiting mechanical part is a third screw, the elastic mechanical part is a spring plate, a second limiting hole is provided on a curved part in a middle part of the spring plate, an inner side of the curved part is opposite the heat sink base, the third screw passes through the second limiting hole to connect to the heat sink base, an outer diameter of a head part of the third screw is greater than an diameter of the second limiting hole, and two ends of the spring plate are separately connected to the heat sink base. In this case, the elastic mechanical part is the spring plate that is curved in the middle, the inner side of the curved part is opposite the heat sink base, and the diameter of the second limiting hole is less than the outer diameter of the head end of the third screw. Therefore, when the third screw in the curved part shortens a distance between the head part of the third screw and the heat sink base, the two ends of the spring plate generate down force on the heat sink base. In this way, implementability of the processor fastening structure in this application can be enhanced.

In some embodiments, a second groove corresponding to the spring plate and a third groove located at the bottom of the second groove are provided on the heat sink base, a first curved part and a second curved part are disposed at a tail end of the spring plate, the first curved part is located in the third groove, and the second curved part is located at the bottom of the second groove. In this case, the third groove is provided at the bottom of the second groove, the second groove and edges of the third groove form a staircase structure, the first curved part and the second curved part are separately disposed at the two ends of the spring plate, the first curved part is located in the third groove, and the second curved part is located at a joint that is of the second groove and that is between the second groove and the third groove. Therefore, in this structure, the third groove is used to provide specific deformation space for the spring plate, and when the spring plate is deformed under pressure, the second curved part generates pressure on the bottom of the second groove. In this way, implementability of the processor fastening structure in this application can be enhanced.

In some embodiments, a third limiting hole is further disposed on a side of the heat sink base, a fourth screw is disposed in the third limiting hole, a second limiting washer is connected to a tail end of the fourth screw, and a distance between the second limiting washer and a head end of the fourth screw is greater than thickness of the heat sink base. Because the third limiting hole and the fourth screw are configured to assist in fastening the heat sink base, and the distance between the head end of the fourth screw and the second limiting washer is greater than the thickness of the heat sink base, when a heat sink assembly is mounted, a nut or a screw that is in the fastening assembly and that corresponds to the fourth screw does not push the fourth screw out of the heat sink base.

In some embodiments, a fourth groove corresponding to the third limiting hole is further provided on the heat sink base, and when the second limiting washer is in contact with the heat sink base, to be specific, a distance between the head end of the fourth screw and the heat sink base reaches a maximum value, in this case, the second limiting washer is located in the fourth groove. In this design, motion space of the fourth screw can be further increased, so that the fourth screw is less likely to be pushed out of the heat sink base.

In some embodiments, the second limiting washer is clamped to the tail end of the fourth screw. In other words, the second limiting washer is connected to the fourth screw in a clamping manner. In this manner, the second limiting washer is detachably connected to the fourth screw, and when in use, the fourth screw is inserted into the third limiting hole, and then the second limiting washer is mounted at the tail end of the fourth screw. In this way, implementability of the processor fastening structure in this application can be enhanced.

In some embodiments, the third limiting holes are located in opposite corners of the heat sink base. The screw in this corner fits the third limiting hole mainly to preliminarily limit the heat sink base to a position, and with a clamped structure in the other corner, the entire heat sink base can be fastened, so that when a heat sink assembly is mounted, the heat sink base is free of tilting on one side.

In some embodiments, a clamped structure is disposed in the other corner of the heat sink base, and the clamped structure fits the third limiting hole to fasten the heat sink base.

In some embodiments, the fastening assembly includes a lining board that is disposed on an upper surface of the PCB and that is located outside the processor slot, and a midplane that is disposed on a lower surface of the PCB and that is located on a rear surface of the processor slot, a second screw fitting the limiting mechanical part is disposed on the midplane, a fourth limiting hole is provided on the lining board, and the second screw passes through the PCB and the fourth limiting hole to limit the lining board to a position. The lining board is disposed along an edge of the processor slot, to ensure that the processor can be smoothly put in place after mounting is complete. The second screw can fit the limiting mechanical part, to be specific, may be the foregoing second screw that fits the first screw, or may be a nut or a screw that fits the third screw.

In some embodiments, a heat sink is fastened on the heat sink base. The heat sink may use a passive heat dissipation design, to be specific, heat sink fins and a heat dissipation duct that is disposed on the heat sink base are used to passively dissipate heat; or may use an air-cooled heat dissipation manner, to be specific, based on passive heat dissipation, an air duct formed in a computer device (for example, a server) and a cooling fan are used, so that heat can be quickly dissipated out of the computer device; or certainly, may use a water-cooled heat dissipation manner, to be specific, a water block is mounted on the heat sink base, and heat dissipating components are mounted inside or outside a shelf of a computer device, where the heat dissipating components are a metal duct and a cooling fan whose air flow direction corresponds to an air flow direction of the metal duct, the water block is connected to a duct, the duct forms circulation between the water block and the heat dissipating components, and the duct is filled with coolant.

A second aspect of the embodiments of this application further provides an assembly, where the assembly includes a processor, a heat sink, and the processor fastening structure according to the first aspect or any one implementation of the first aspect.

A third aspect of the embodiments of this application further provides a computer device, where the computing device includes the processor fastening structure according to the first aspect or any one implementation of the first aspect.

According to a fourth aspect, this application provides a mechanical part for fastening a processor, where the mechanical part is configured to fasten a processor on a printed circuit board; the mechanical part includes a heat sink base and a fastening assembly, compression springs and first screws are disposed on the heat sink base, first vias are further provided on the heat sink base, a tail end of the first screw passes through the compression spring and the first via to connect to the fastening assembly, a diameter of a head end of the first screw is greater than an inner diameter of the compression spring, and the compression spring is located between the head end of the first screw and the heat sink base.

The processor is disposed between the heat sink base and the printed circuit board. Therefore, a three-layer structure including the heat sink base, the processor, and the printed circuit board may be tightly pressed by rotating the first screw to adjust elastic force of the compression spring, so that the processor and the printed circuit board are in good electrical contact.

According to the fourth aspect, in a first possible implementation of the fourth aspect, the fastening assembly is configured to connect to the printed circuit board, the printed circuit board includes a processor slot, the processor slot is configured to connect to the processor, and heat sink fins are disposed on the heat sink base.

The slot provided on the printed circuit board is configured to facilitate an electrical connection between the processor and the printed circuit board, the fastening assembly is fastened on the printed circuit board, and the first screw is mechanically connected to the fastening assembly. A height of the first screw is adjusted to enable the compression spring to apply pressure on the heat sink base, so that the processor is tightly pressed, and the processor and the printed circuit board are in good contact. The heat sink fins disposed on a heat sink base are configured to dissipate heat from the processor.

According to the fourth aspect or the first possible implementation of the fourth aspect, in a second possible implementation of the fourth aspect, an outer diameter of the compression spring is greater than a diameter of the first via.

Because the outer diameter of the compression spring is greater than the diameter of the first via, a washer may not be used, so that the compression spring is in direct contact with the heat sink base, and the compression spring directly provides pressure on the heat sink base.

According to any one of the fourth aspect or the foregoing possible implementations of the fourth aspect, in a third possible implementation of the fourth aspect, a washer is further disposed between the compression spring and the heat sink base, a second via is provided on the washer, the washer is sheathed over the first screw, a diameter of the washer is greater than the diameter of the first via, and the outer diameter of the compression spring is greater than a diameter of the second via.

The washer may enable the pressure provided by the compression spring for the heat sink base to be more even.

According to any one of the fourth aspect or the foregoing possible implementations of the fourth aspect, in a fourth possible implementation of the fourth aspect, a diameter of the tail end of the first screw is greater than the diameter of the first via.

Because the diameter of the tail end of the first screw is greater than the diameter of the first via, the first screw can be prevented from falling from the heat sink base, and disassembly and assembly of the processor are facilitated.

According to any one of the fourth aspect or the foregoing possible implementations of the fourth aspect, in a fifth possible implementation of the fourth aspect, a first limiting washer is further disposed at the tail end of the first screw, the first limiting washer is sheathed over the first screw, the heat sink base is located between the compression spring and the first limiting washer, an inner diameter of the first limiting washer is less than the diameter of the tail end of the first screw, and an outer diameter of the first limiting washer is greater than the diameter of the first via.

The first limiting washer can also prevent the first screw from falling from the heat sink base, so that disassembly and assembly of the processor are facilitated.

According to the fifth possible implementation of the fourth aspect, in a sixth possible implementation of the fourth aspect, a first groove is further provided on a surface that is of the heat sink base and that is in contact with the first limiting washer, and when the first limiting washer is in contact with the heat sink base, the first limiting washer is located in the first groove.

The first groove is larger than the first limiting washer in size, so that motion space of the first screw can be larger, and alignment and assembly are facilitated.

According to any one of the fourth aspect or the foregoing possible implementations of the fourth aspect, in a seventh possible implementation of the fourth aspect, a third via and a fourth screw are further provided on the heat sink base, a tail end of the fourth screw passes through the third via to connect to the fastening assembly, and a diameter of a head end of the fourth screw is greater than a diameter of the third via.

The fourth screw may play a role of pre-fastening the heat sink base, the processor, and the printed circuit board, so that device assembly is facilitated.

According to the seventh possible implementation of the fourth aspect, in an eighth possible implementation of the fourth aspect, a second limiting washer is further disposed at the tail end of the fourth screw, the second limiting washer is sheathed over the fourth screw, the heat sink base is located between the head end of the fourth screw and the second limiting washer, an inner diameter of the second limiting washer is less than a diameter of the tail end of the fourth screw, and an outer diameter of the second limiting washer is greater than the diameter of the third via.

The second limiting washer can prevent the fourth screw from falling from the heat sink base, so that device assembly is facilitated.

According to the eighth possible implementation of the fourth aspect, in a ninth possible implementation of the fourth aspect, a fourth groove is further provided on a surface that is of the heat sink base and that is in contact with the second limiting washer, and when the second limiting washer is in contact with the heat sink base, the second limiting washer is located in the fourth groove.

The fourth groove is larger than the second limiting washer in size, so that motion space of the fourth screw can be larger, and alignment and assembly are facilitated.

According to any one of the fourth aspect or the foregoing possible implementations of the fourth aspect, in a tenth possible implementation of the fourth aspect, inner threads are provided at the tail end of the first screw, a second screw is disposed on the fastening assembly, outer threads of the second screw fit the inner threads of the first screw, and the first screw is connected to the fastening assembly by using the second screw.

According to the tenth possible implementation of the fourth aspect, in an eleventh possible implementation of the fourth aspect, the fastening assembly includes a lining board and a midplane, the lining board is disposed on an upper surface of the printed circuit board, the midplane is disposed on a lower surface of the printed circuit board, the second screw is disposed on the midplane, and the second screw is configured to pass through the printed circuit board and the lining board to connect to the first screw.

According to the eleventh possible implementation of the fourth aspect, in a twelfth possible implementation of the fourth aspect, the midplane further includes a fastening screw, the fastening screw is configured to pass through the printed circuit board and the lining board, to connect the lining board and the printed circuit board by using a nut.

The midplane and the lining board are made into a detachable assembly, so that different printed circuit boards can be fit. The fastening screw and the nut are used to fasten the midplane and the lining board to the printed circuit board as a whole, and then the processor is mounted.

According to the twelfth possible implementation of the fourth aspect, in a thirteenth possible implementation of the fourth aspect, inner threads are provided at the tail end of the fourth screw, outer threads of the fastening screw fit the inner threads of the fourth screw, and the fourth screw is connected to the fastening assembly by using the fastening screw.

According to the thirteenth possible implementation of the fourth aspect, in a fourteenth possible implementation of the fourth aspect, the mechanical part further includes a cover, and the cover is configured to carry the processor and fasten the processor to the heat sink base.

The cover includes a fastener, and the fastener on the cover can clamp the cover carrying the processor to the heat sink base. In this way, alignment of a processor pin in a mounting process is facilitated, horizontal movement of the processor in a mounting process can be reduced, and a risk of damaging the processor pin or the printed circuit board is reduced.

According to the fourteenth possible implementation of the fourth aspect, in a fifteenth possible implementation of the fourth aspect, a dowel is further disposed on the lining board, and the dowel is configured to pass through the cover and a limiting hole in the heat sink base to limit the processor to a position.

Because the dowel is configured to limit the cover and the heat sink base to positions, alignment is facilitated, horizontal movement of the processor in a mounting process can be reduced, and damage to a processor pin is reduced.

According to any one of the fourth aspect or the foregoing possible implementations of the fourth aspect, in a sixteenth possible implementation of the fourth aspect, the mechanical part includes at least two first screws and at least two compression springs.

A plurality of compression springs can even pressure, so that electrical contact between the processor and the printed circuit board is better.

According to any one of the fourth aspect or the foregoing possible implementations of the fourth aspect, in a seventeenth possible implementation of the fourth aspect, a free height of the compression spring is less than a length of the first screw.

Because the free height of the compression spring is less than the length of the first screw, the compression spring in a disassembled state does not provide pressure for the heat sink base, and device mounting is facilitated. Certainly, the free height of the compression spring may be alternatively greater than the length of the first screw, and in this case, the compression spring in a disassembled state still provides specific pressure for the heat sink base.

According to a fifth aspect, this application provides a processor assembly, where the assembly includes a processor and the mechanical part for fastening a processor according to any one of the fourth aspect or the foregoing possible implementations of the fourth aspect.

According to a sixth aspect, this application provides a computer device, where the computer device includes the processor assembly according to the fifth aspect.

According to the technical solutions disclosed in this application, with a series of design optimization, the compression spring replaces a conventional spring plate structure. Therefore, pressure on the processor may be more even, electrical contact between the processor and the printed circuit board is better, and a device mounting process is facilitated.

DESCRIPTION OF EMBODIMENTS

Embodiments of this application provide a processor fastening structure, an assembly, and a computer device. A fastening assembly and a heat sink base that are fastened on a PCB are redesigned to improve a total pressure load of a CPU, so that bonding between a heat sink and the CPU is tighter, thereby ensuring enduring heat dissipation performance and contact reliability between the CPU and a processor slot.

Compared with a consumer-grade CPU, a server CPU provides much more powerful processing performance. Therefore, to implement high performance, a larger packaging area than that of the consumer-grade CPU is required. The Intel Xeon CPU family is used as an example. A quantity of pins of this CPU family increases from initial 603 to 771, to 1155, 1356, and 2011, and even to 3647 in V5 version. Such a huge quantity of pins means that an area of the CPU is also increasingly enlarged. For example, an area of a CPU with 3647 pins is approximately 80% larger than an area of a CPU with 2011 pins. This means that a total pressure load of the CPU with 3647 pins also increases to 200-300 pound-force (lbf), where 1 lbf=4.45 newton (N), in other words, the pressure needs to reach 890 N to 1335 N; and 1 kilogram-force (kgf)=9.81 N, in other words, the pressure needs to reach 90.7 kgf to 136 kgf.

Because the CPU generates a large amount of heat during operating, and an excessively high temperature causes damage to the CPU, a heat sink assembly is required to dissipate heat from the CPU. Currently, although the area of the CPU is enlarged greatly, an area of a processor slot on a mother board does not increase. This means that a heat sink with a more powerful heat dissipation capability is required to dissipate heat from the CPU. In addition, because of the huge quantity of pins, to ensure tight bonding between such a large quantity of pins and the processor slot, adequate pressure needs to be applied on the CPU, so that operating pressure on each pin of the CPU during operating is 10 gf to 25 gf. However, in some approaches, a fastening structure and a heat sink that fit each other and that are used in a processor slot of the CPU with 3647 pins cannot increase adequate pressure on the CPU. The following describes an existing processor fastening structure.

Figure 1:
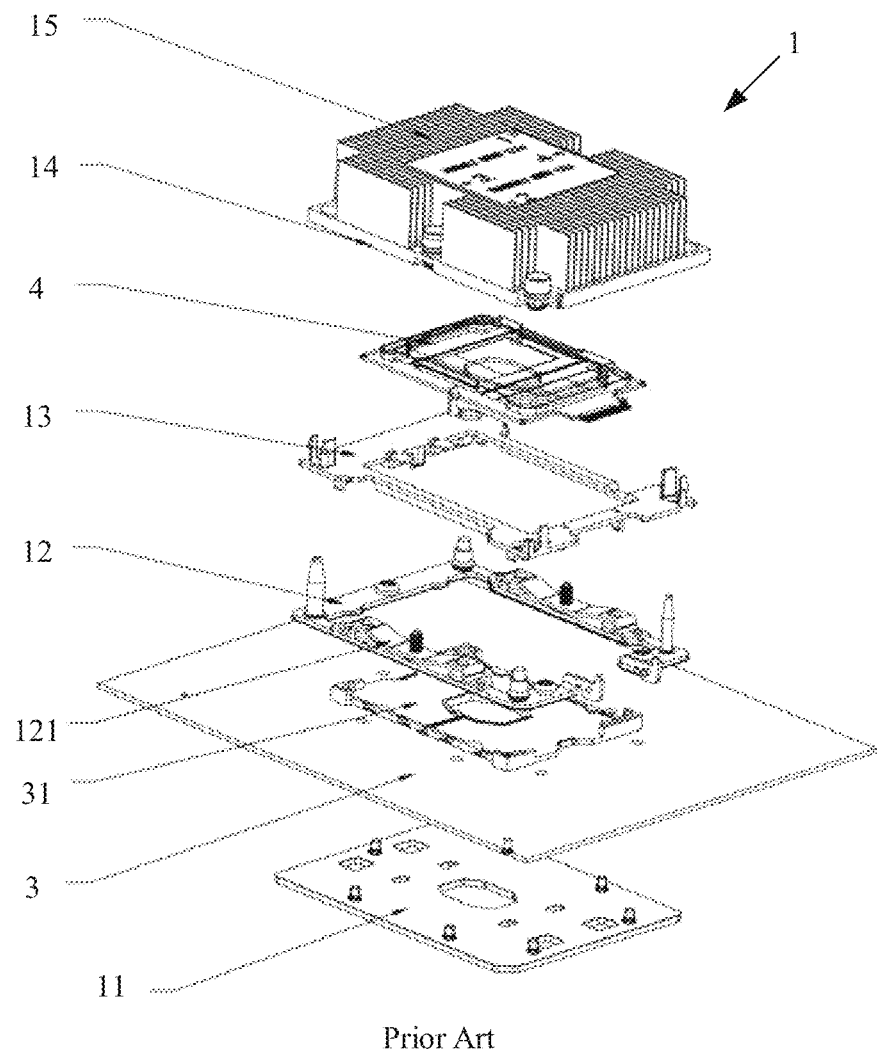
FIG. 1 is a schematic exploded diagram of an existing processor fastening structure.

FIG. 1 is a schematic exploded diagram of an existing processor fastening structure. The processor fastening structure 1 includes a midplane 11 disposed on a rear surface of a PCB 3 and a lining board 12 that is disposed on a front surface of the PCB 3 and that corresponds to a position of the midplane 11. The midplane 11 and the lining board 12 are fastened on the PCB 3 by passing a screw through the PCB 3. Then, a processor 4 is fastened on a cover 13, and an assembly including the processor 4 and the cover 13 is fastened to a heat sink base 14. Finally, an assembly including the processor 4, the cover 13, the heat sink base 14, and a heat sink 15 on the heat sink base 14 is mounted into a processor slot 31. Spring plates 121 are disposed on two sides of the lining board 12, two ends of each spring plate 121 are fastened to the lining board 12, a screw is mounted in a middle part of the spring plate 121, a tail end of the screw passes through the spring plate 121, and a nut is disposed on the heat sink base 14 and located in a position corresponding to the screw. The nut is tightened to move the head end of the screw towards the heat sink base 14, so that tensile force is generated on the spring plate 121, the PCB 3 is pulled towards the heat sink base 14, the heat sink base 14 provides pressure for the processor 4, and the processor 4 and the processor slot 31 are tightly bonded together.

However, it can be learned that because the tensile force is generated for the PCB board by using the spring plate 121, an extreme of an acting force is too limited to meet a requirement of the total pressure load of the CPU with 3647 pins; and because the manner of pulling the spring plate is adopted, and elastic force of the spring plate decays more than a spring under long-term pressure, after a plurality of times of disassembly and assembly, elasticity of the spring plate 121 is likely reduced and even disappears, and usually, the elastic force of the spring plate decreases after the heat sink is disassembled and assembled for more than six times.

Embodiment 1

Figure 2:
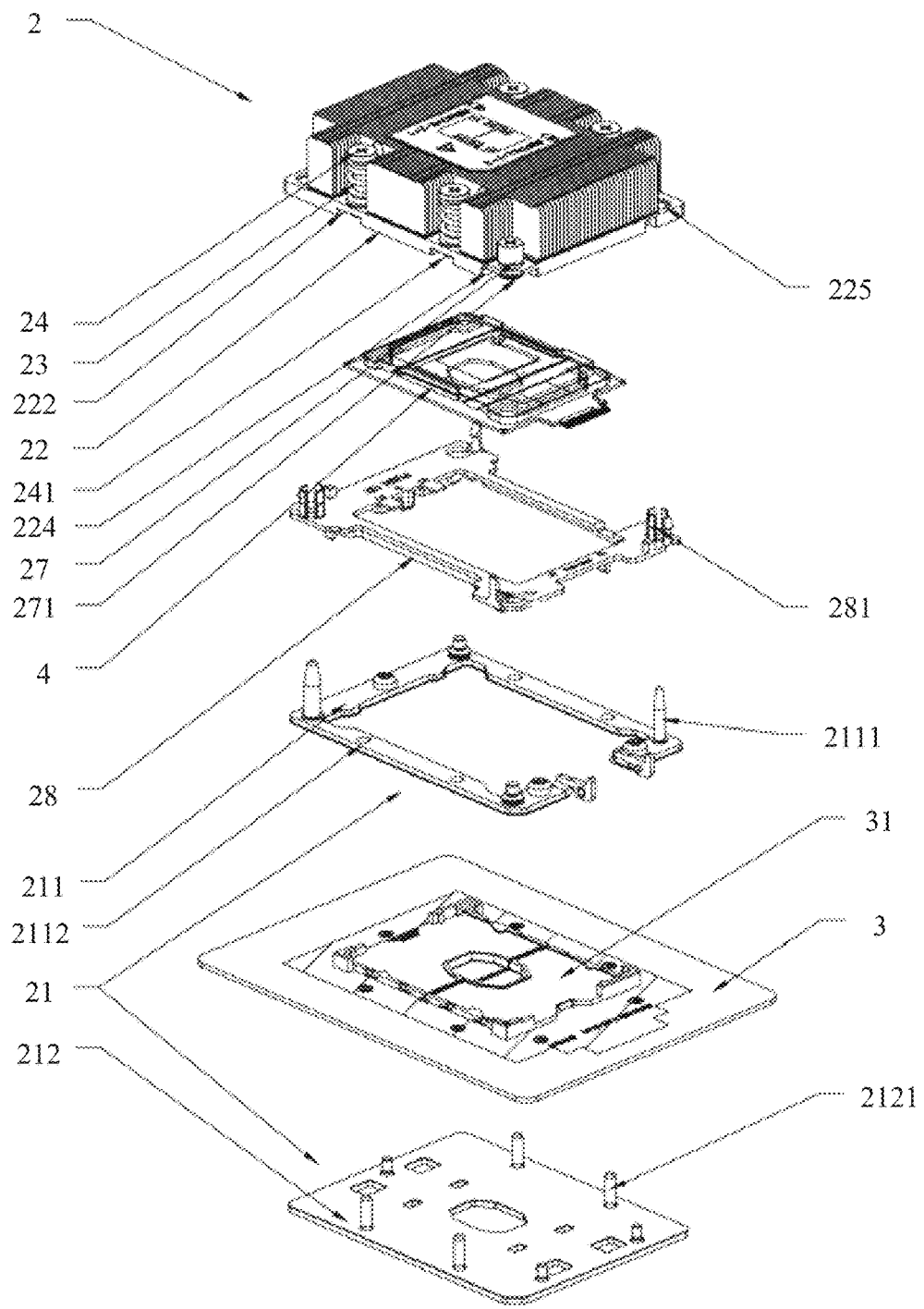
FIG. 2 is a schematic exploded diagram of a processor fastening structure according to an embodiment of this application.

To resolve the foregoing problem, this application provides a processor fastening structure. FIG. 2 is a schematic exploded diagram of a processor fastening structure according to an embodiment of this application. The processor fastening structure 2 includes a heat sink base 22, and the heat sink base 22 is in contact with a processor 4.

Optionally, the processor fastening structure 2 further includes a fastening assembly 21. The fastening assembly 21 is fastened in a processor slot 31 on a PCB 3, and the heat sink base 22 in contact with the processor 4 is mounted on the fastening assembly 21. Therefore, the heat sink base 22 is fastened on the fastening assembly 21.

An elastic mechanical part and a limiting mechanical part configured to limit the elastic mechanical part to a position are disposed on a side of the heat sink base 22, one end of the limiting mechanical part passes through the elastic mechanical part to connect to the fastening assembly 21, and the elastic mechanical part is located between the other end of the limiting mechanical part and the heat sink base 22.

It can be learned that the elastic mechanical part is disposed on the heat sink base 22, the limiting mechanical part is disposed on the elastic mechanical part, one end of the limiting mechanical part passes through the elastic mechanical part to connect to the fastening assembly 21, and the elastic mechanical part is located between the other end of the limiting mechanical part and the heat sink base 22. Therefore, the elastic mechanical part can be compressed by shortening a distance between the other end of the limiting mechanical part and the heat sink base 22. When the elastic mechanical part is compressed by using the limiting mechanical part, the elastic mechanical part provides elastic force for both the limiting mechanical part and the heat sink base 22. In addition, because the limiting mechanical part passes through the elastic mechanical part to connect to the fastening assembly, the elastic force of the elastic mechanical part is converted into pressure from the heat sink base to a CPU. In this way, pressure on the CPU can be increased to meet an increased total pressure load.

It should be noted that, in this embodiment of this application, the elastic mechanical part and the limiting mechanical part are disposed on the heat sink base to enhance pressure from the heat sink base to the processor. There are a plurality of types of elastic mechanical parts. For example, the elastic mechanical part is a spring plate or a compression spring, certainly, provided that the elastic mechanical part can be compressed by shortening the distance between the other end of the limiting mechanical part and the heat sink base. The following separately describes implementation methods for the spring plate and the compression spring.

Embodiment 2

Figure 3:
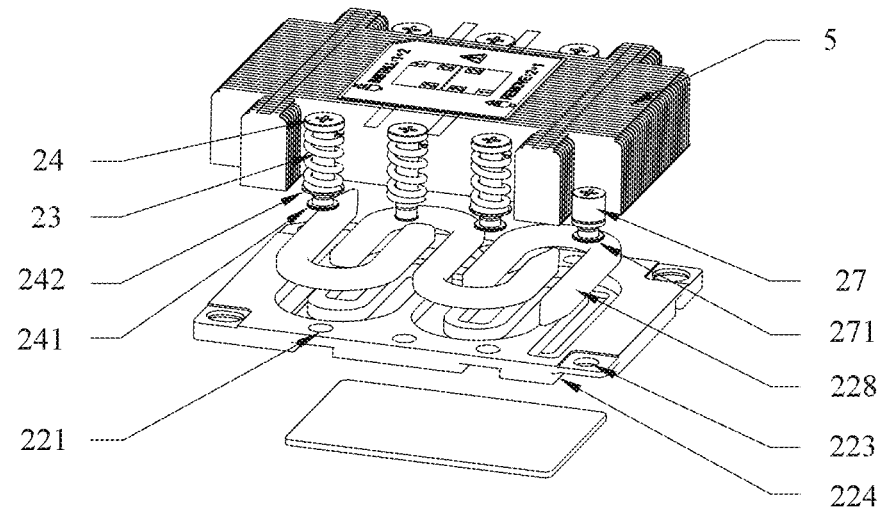
FIG. 3 is an embodiment diagram of a processor fastening structure according to an embodiment of this application.

In this embodiment, based on Embodiment 1, as shown in FIG. 2 and FIG. 3, FIG. 3 is an embodiment diagram of a processor fastening structure according to an embodiment of this application. The elastic mechanical part is a compression spring 23, the limiting mechanical part is a first screw 24, the compression spring 23 is sheathed over the first screw 24, a diameter of a head end of the first screw 24 is greater than an inner diameter of the compression spring 23, and two ends of the compression spring 23 are located between the head end of the first screw 24 and the heat sink base 22. In this case, because the diameter of the head end of the first screw 24 is greater than the inner diameter of the compression spring 23, the first screw 24 may be tightened to shorten a distance between the head end of the first screw 24 and the heat sink base 22, to achieve a purpose of compressing the compression spring 23, so that elastic force generated by the compression spring 23 has an action on the heat sink base 22.

Optionally, a first limiting hole 221 is disposed on the heat sink base 22, a tail end of the first screw 24 passes through the first limiting hole 221 to connect to the fastening assembly 21, a first limiting washer 241 is further disposed at the tail end of the first screw 24, the heat sink base 22 is located between the first limiting washer 241 and the compression spring 23, and an outer diameter of the first limiting washer 241 is greater than an diameter of the first limiting hole 221. In this structure, the heat sink base 22 is located between the first limiting washer 241 and the compression spring 23, and because the outer diameter of the first limiting washer 241 is greater than the diameter of the first limiting hole 221, the first limiting washer 241 can lock the first screw 24 to the heat sink base 22, so that the first screw 24 does not fall from the heat sink base 22.

Optionally, the first limiting washer 241 is clamped to the tail end of the first screw 24. In other words, the first limiting washer 241 is connected to the first screw 24 in a clamping manner. In this manner, the first limiting washer 241 may be detachably connected to the first screw 24, and when in use, the first screw 24 is inserted into the first limiting hole 221 and then the first limiting washer 241 is mounted at the tail end.

Optionally, when the first limiting washer 241 is in contact with the heat sink base 22, to be specific, a distance between the head end of the first screw 24 and the heat sink base 22 reaches a maximum value, in this case, a free height of the compression spring 23 is less than the distance between the head end of the first screw 24 and the heat sink base 22. In this disposition, the compression spring 23 is not pre-compressed, and a specific gap is reserved between the compression spring 23 in a free state and the heat sink base 22 or the head end of the first screw 24. Therefore, mounting inconvenience caused in the following case can be resolved: when a heat sink is mounted, and specifically one side of the heat sink base 22 is mounted onto the fastening assembly 21, the other side of the heat sink base 22 tilts upwards, and the other side of the heat sink base 22 cannot be manually pressed down.

Figure 4:
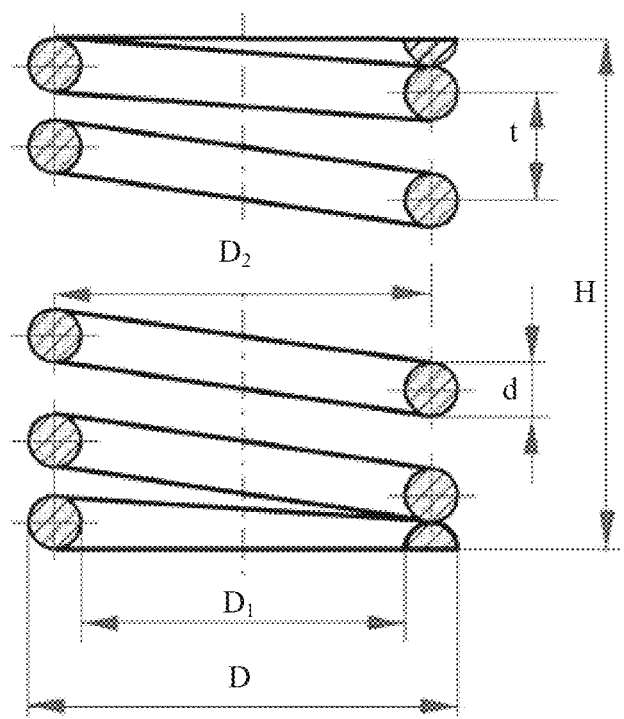
FIG. 4 is an embodiment diagram of a compression spring in a processor fastening structure according to an embodiment of this application.

It should be noted that various parameters of the compression spring are shown in FIG. 4. FIG. 4 is a schematic structural diagram of a compression spring in a processor fastening structure according to an embodiment of this application. Active coils of the compression spring 23 are spring coils compressed to maintain equal coil spacings, and a quantity of active coils is used to calculate spring stiffness. Supporting coils of the compression spring 23 are spring coils designed at an end part of the compression spring 23 to support or fasten the compression spring 23. As shown in FIG. 3, a diameter of a spring wire of the compression spring 23 is d, and an outer diameter of the compression spring 23 is D. If the spring is approximated to a cylinder, a diameter of the cylinder is the outer diameter of the compression spring 23, and a value of an inner diameter D1 of the compression spring 23 is D−2d, and a value of a mean diameter D2 of the compression spring 23 is D−d; if a distance t between spring wires in same positions of two adjacent active coils is a coil spacing of the compression spring 23, the quantity of active coils is n, and the quantity of supporting coils is n1, a height H of the compression spring 23 is n×t+(n1−0.5)×d. If the compression spring 23 is an equal-diameter compression spring, regardless of whether the active coils have a same inner diameter or the supporting coils have a same inner diameter, an inner diameter of the end part of the compression spring 23 is the inner diameter of the compression spring 23; or if the compression spring 23 is a variable-diameter compression spring, to be specific, not all inner diameters of active coils are the same, and the inner diameters of the active coils are not all the same as the inner diameter of the end part, in this case, the first screw 24 can limit the end part of the compression spring 23 to a position provided that the inner diameter of the end part is less than an outer diameter of a head part of the first screw 24. In this embodiment of this application, either the equal-diameter compression spring or the variable-diameter compression spring may be used. Elastic force of the spring is F=ka, where k indicates spring stiffness, measured in newton per millimeter (N/mm), and a indicates deflection, in other words, an amount of spring compression, measured in mm. A total length of the spring is y=kx+b, where y indicates a total length of the spring, b indicates a length of the spring in a free state, k indicates spring stiffness, x indicates acting force applied to the spring, k=EI/L, E indicates an elastic modulus of a spring material (in other words, resistance to being deformed under unit force), I indicates a geometric parameter consisting of spring dimensions, and L indicates the total length of the spring.

It should be noted that a relationship curve between a load F (or T) and deformation f (or η) is referred to as a characteristic curve of the spring. The characteristic curve of the spring generally has three types: (1) a linear type; (2) an incremental type; and (3) a decremental type. In addition, a ratio of a load increment dF (or dT) and a deformation increment df (or dη) is a load used for generating unit deformation and is referred to as stiffness of a spring. Stiffness of a compression spring and stiffness of an extension spring are F=dF/df, and stiffness of a torsion spring is T=dT/dη.

In this embodiment of this application, pressure from a single compression spring 23 to the heat sink base 22 is approximately 30 kgf, in other words, elastic force generated by the single compression spring 23 is nearly 294.3 N. Therefore, a total pressure load of the processor 4 can be met by using approximately four compression springs 23.

Optionally, a first groove 222 is further provided on a surface that is of the heat sink base 22 and that is opposite the first limiting washer 241, and when the first limiting washer 241 is in contact with the heat sink base 22, to be specific, the distance between the head end of the first screw 24 and the heat sink base 22 reaches a maximum value, the first limiting washer 241 is located in the first groove 222. In this design, larger motion space can be provided for the first screw 24, so that a compression spring 23 of a higher free height can be sheathed over the first screw 24 to meet different pressure load requirements; and because the first limiting washer 241 is located in the first groove 222, when the heat sink base 22 is mounted, the first limiting washer 241 does not press against the fastening assembly, and the mounting can be facilitated.

Optionally, because an end part of the compression spring 23 is in contact with the heat sink base 22, and a contact area between the end part and the heat sink base 22 is limited, pressure on the heat sink base 22 is likely unbalanced. In this case, a washer 242 is further disposed over the first screw 24 and between the heat sink base 22 and the compression spring 23. The washer 242 can increase the contact area between the compression spring 23 and the heat sink base 22, and can prevent direct contact between the end part of the compression spring 23 and the heat sink base 22. Because the heat sink base 22 is generally made of relatively soft material such as aluminum alloy or copper, and the end part of the compression spring 23 is relatively sharp, metal filings easily peel off from the material. The washer 242 may be a steel sheet made of stainless steel, and therefore can effectively resolve this problem.

Optionally, there are more than two compression springs 23 and more than two first screws 24, and the more than two compression springs 23 are symmetrically distributed on two sides of the heat sink base 22. Because the processor 4 is generally a regular structure, and when a heat sink structure is mounted, pressure from the heat sink base 22 to each contact part of the processor needs to be even, bonding between the processor 4 and the heat sink base 22 is tighter, and stress on the PCB board can be reduced. In this case, the more than two compression springs 23 are symmetrically distributed, so that down force on the two sides of the heat sink base 22 is the same, and pressure on each part of the processor 4 is also the same. As shown in FIG. 1, in FIG. 1, two compression springs 23 are separately disposed on two sides of the heat sink base 22. In this case, the two sides each can provide nearly 588.6 N pressure for the heat sink base 22.

Figure 5A:
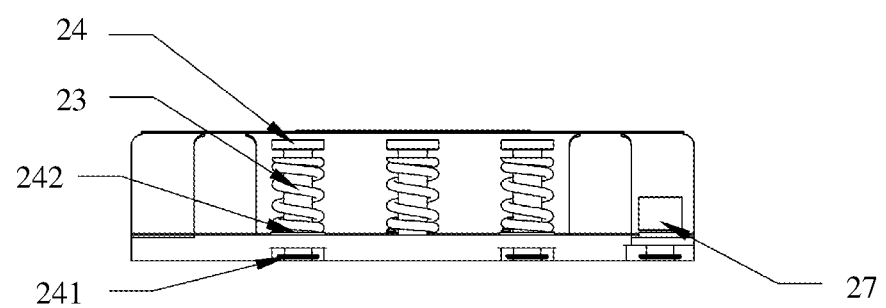
FIG. 5A is an embodiment diagram of a processor fastening structure according to an embodiment of this application.
Figure 5B:
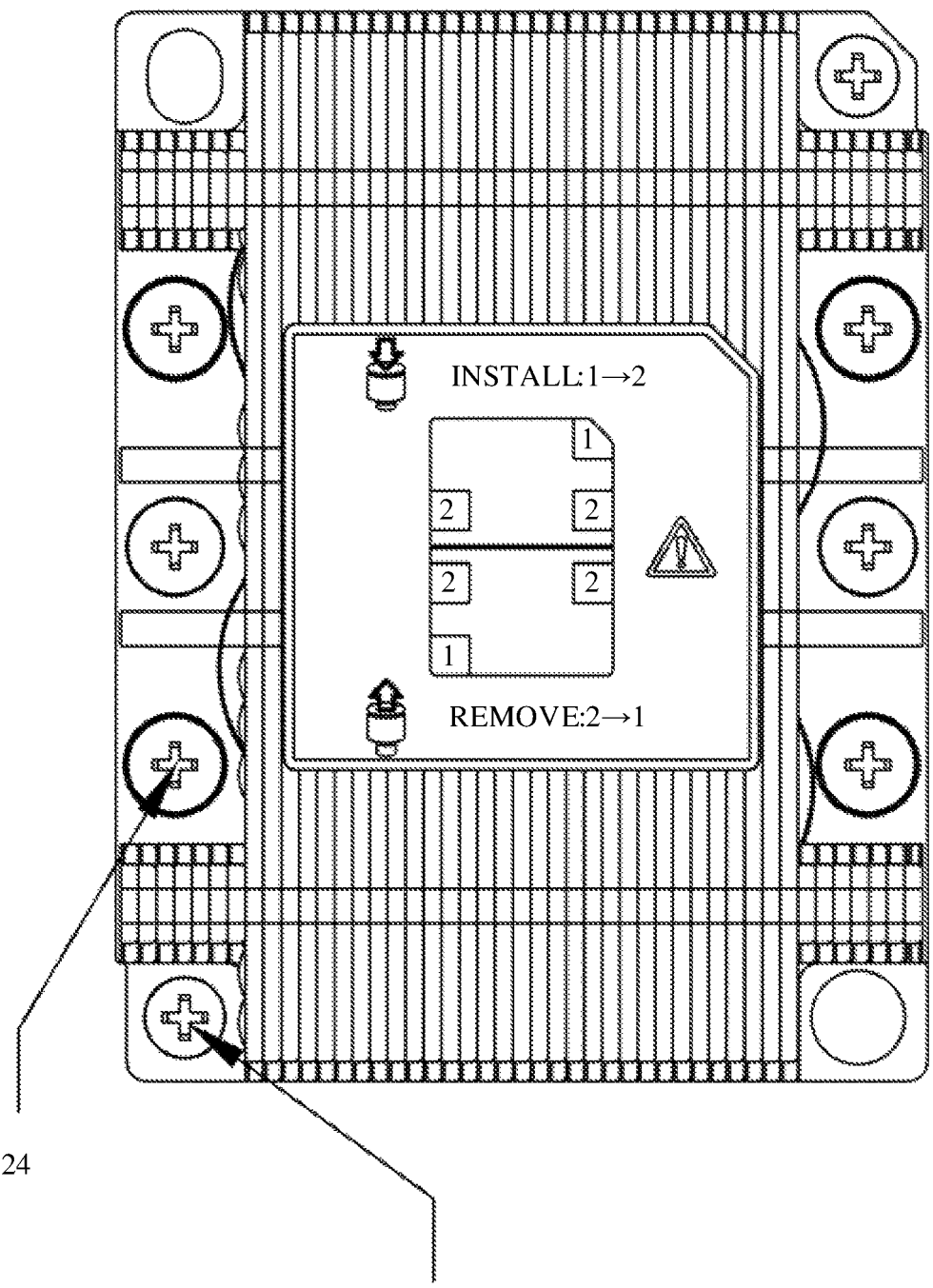
FIG. 5B is an embodiment diagram of a processor fastening structure according to an embodiment of this application.
Figure 5C:
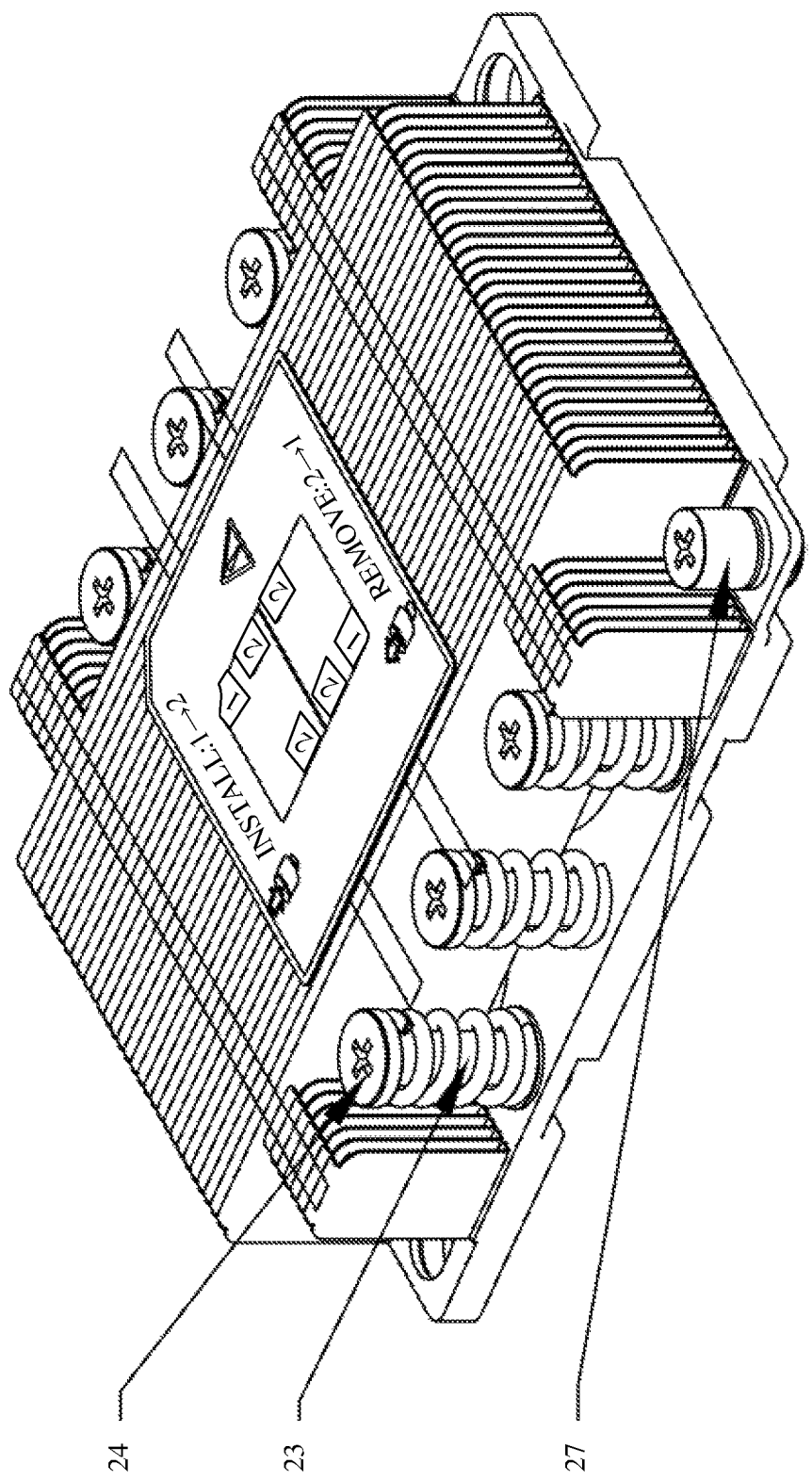
FIG. 5C is an embodiment diagram of a processor fastening structure according to an embodiment of this application.

It should be noted that two compression springs 23 may be separately used on the two sides, or three compression springs 23 may be separately used on the two sides, as shown in FIG. 3, FIG. 5A, FIG. 5B, and FIG. 5C. FIG. 5A is an embodiment diagram of a processor fastening structure according to an embodiment of this application. FIG. 5B is an embodiment diagram of a processor fastening structure according to an embodiment of this application. FIG. 5C is an embodiment diagram of a processor fastening structure according to an embodiment of this application. It may be understood that when three compression springs 23 are separately disposed on the two sides of the heat sink base 22, more pressure can be provided for the heat sink base, and a higher pressure requirement of the processor 4 can be met.

Optionally, inner threads 243 are provided at the tail end of the first screw 24, a second screw 2121 corresponding to the first screw 24 is disposed on the fastening assembly 21, and outer threads of the second screw 2121 fit the inner threads 243 provided at the tail end of the first screw. To facilitate position limiting in the first limiting hole 221 and facilitate mounting of the first limiting washer 241, the first screw 24 provides the inner threads 243 at the tail end and an entire side face of the first screw 24 may be a smooth cylindrical surface. In addition, because of this design manner of the first screw 24, the second screw 2121 is a second screw 2121 that provides the outer threads and fits the first screw 24, and the second screw 2121 is fastened on the fastening assembly 21. Because the inner threads are provided at the tail end of the first screw 24 and the outer threads are provided on the second screw 2121, the first screw 24 may also be a nut. It can be learned that the first screw 24 and the second screw 2121 may both be screws or nuts, or one is a screw and the other is a nut, provided that the first screw 24 and the second screw 2121 are components that can be bolted together.

Figure 6A:
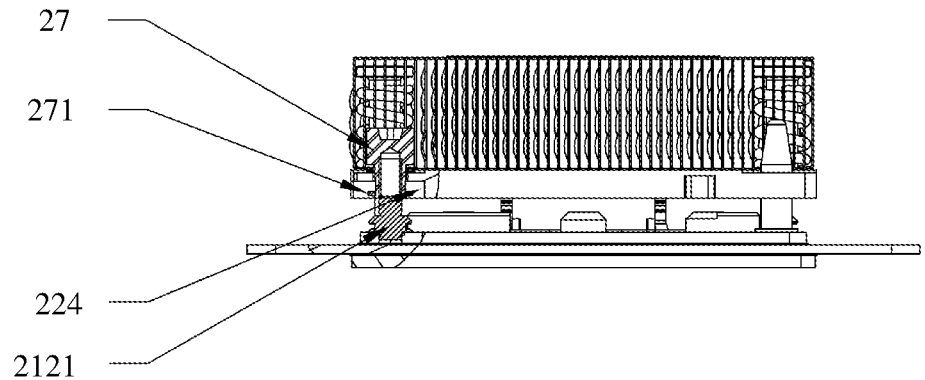
FIG. 6A is an embodiment diagram of a processor fastening structure according to an embodiment of this application.
Figure 6B:
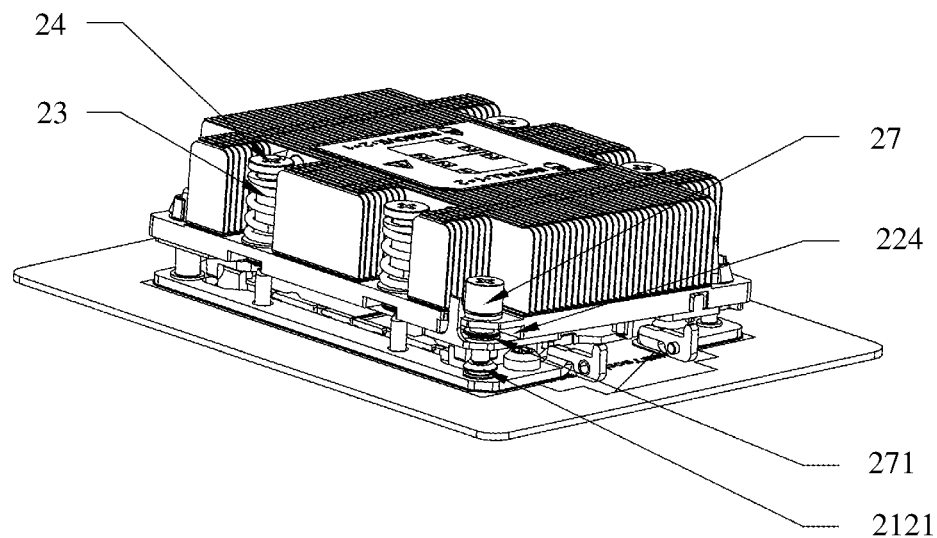
FIG. 6B is an embodiment diagram of a processor fastening structure according to an embodiment of this application.
Figure 6C:
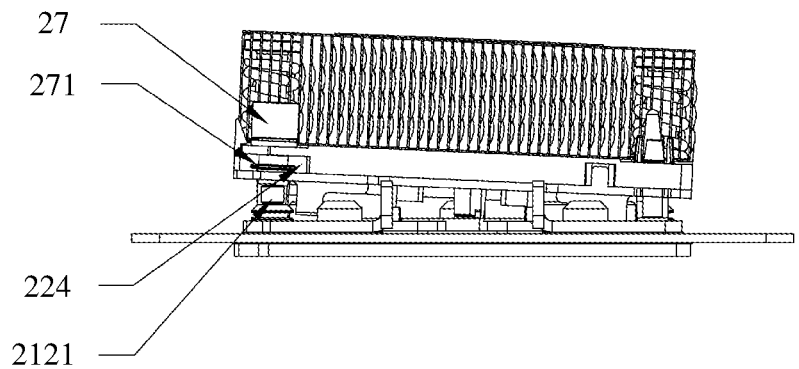
FIG. 6C is an embodiment diagram of a processor fastening structure according to an embodiment of this application.
Figure 6D:
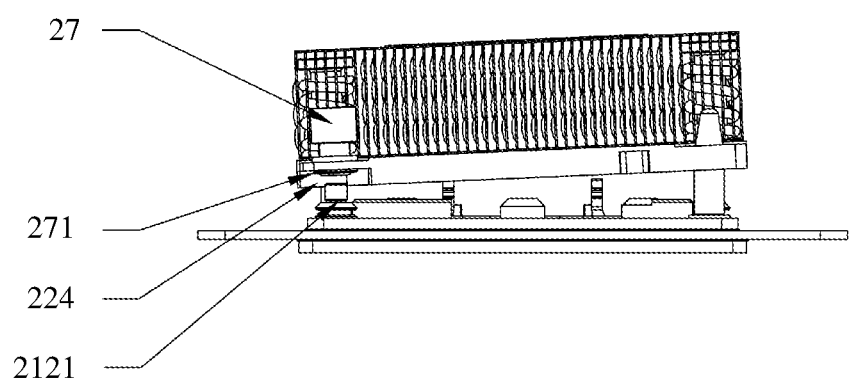
FIG. 6D is an embodiment diagram of a processor fastening structure according to an embodiment of this application.
Figure 6E:
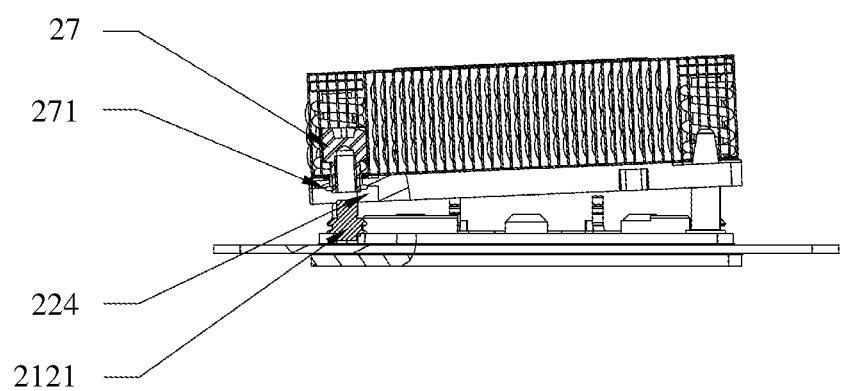
FIG. 6E is an embodiment diagram of a processor fastening structure according to an embodiment of this application.

Optionally, FIG. 6A is an embodiment diagram of a processor fastening structure according to an embodiment of this application. FIG. 6B is an embodiment diagram of a processor fastening structure according to an embodiment of this application. FIG. 6C is an embodiment diagram of a processor fastening structure according to an embodiment of this application. FIG. 6D is an embodiment diagram of a processor fastening structure according to an embodiment of this application. FIG. 6E is an embodiment diagram of a processor fastening structure according to an embodiment of this application. A third limiting hole 223 is further provided on a side of the heat sink base 22, a fourth screw 27 is disposed in the third limiting hole 223, a second limiting washer 271 is connected to a tail end of the fourth screw 27, and a distance between the second limiting washer 271 and a head end of the fourth screw 27 is greater than thickness of the heat sink base 22. Because the third limiting hole 223 and the fourth screw 27 are configured to assist in fastening the heat sink base 22, and the distance between the head end of the fourth screw 27 and the second limiting washer 271 is greater than the thickness of the heat sink base 22, when a heat sink assembly is mounted, a nut or a screw that is in the fastening assembly 21 and that corresponds to the fourth screw 27 does not push the fourth screw 27 out of the heat sink base 22.

Optionally, a fourth groove 224 corresponding to the third limiting hole 223 is further disposed on the heat sink base 22, and when the second limiting washer 271 is in contact with the heat sink base 22, to be specific, a distance between the head end of the fourth screw 27 and the heat sink base 22 reaches a maximum value, in this case, the second limiting washer 271 is located in the fourth groove 224. In this design, motion space of the fourth screw 27 can be further increased, so that the fourth screw 27 is less likely to be pushed out of the heat sink base 22.

Optionally, the second limiting washer 271 is clamped to the tail end of the fourth screw 27. In other words, the second limiting washer 271 is connected to the fourth screw 27 in a clamping manner. In this manner, the second limiting washer 271 is detachably connected to the fourth screw 27, and when in use, the fourth screw 27 is inserted into the third limiting hole 223, and then the second limiting washer 271 is mounted at the tail end of the fourth screw 27.

Optionally, the third limiting holes 223 are located in opposite corners of the heat sink base 22. The fourth screw 27 in this corner fits the third limiting hole 223 mainly to preliminarily limit the heat sink base 22 to a position, and with a clamped structure in the other corner, the entire heat sink base 22 can be fastened, so that when a heat sink assembly is mounted, the heat sink base 22 is free of tilting on one side.

Optionally, a clamped structure is disposed in the other corner of the heat sink base 22, and the clamped structure fits the third limiting hole 223 to fasten the heat sink base 22. The clamped structure includes a first fastener 281 disposed on a cover 28 that is configured to fasten the processor 4, a second fastener 225 disposed on the heat sink base 22, and a dowel 2111 disposed on a lining board 211. The first fastener 281, the second fastener 225, and the dowel 2111 fit each other to fasten the heat sink base 22 to the lining board 211. The fastening assembly 21 includes the lining board 211 and a midplane 212.

Specifically, in FIG. 6A, according to a state in which the two sides of the heat sink base 22 are mounted on the processor 4 and a state of the fourth screw 27, it can be learned that edges of the heat sink base 22 are fastened because inner threads of the fourth screw 27 fit the outer threads of the second screw 2121 in the fastening assembly. FIG. 6B to FIG. 6D show cases in which one side of a heat sink base tilts upwards when an incorrect mounting manner is used during mounting. FIG. 6B and FIG. 6C show states in which one side that is of the heat sink base 22 and on which a clamped structure is disposed is mounted on the processor 4. It can be learned that, in FIG. 6B and FIG. 6C, because one side on which the fourth screw 27 is disposed tilts upwards, during mounting, only the side needs to be pressed down, and because the fourth groove 224 is provided, when one side of the heat sink base 22 tilts upwards, the fourth screw 27 has a sufficient margin to avoid being pushed by the second screw 2121 out of the heat sink base 22. FIG. 6D and FIG. 6E are cases in which the other side that is of the heat sink base 22 and that is different from the cases in FIG. 6B and FIG. 6C tilts upwards. To be specific, this is equivalent to a case in which one side on which the fourth screw 27 is disposed is mounted and one side on which a clamped structure is disposed is not mounted. In this case, because the other side tilts upwards, a distance between the fourth screw 27 and the second screw 2121 is reduced. However, because the fourth screw 27 and the second screw 2121 are bolted, an angle is formed between the fourth screw 27 and the second screw 2121, and the fourth screw 27 cannot be tightened to the second screw 2121. In this way, the fourth screw 27 can have adequate space provided that the fourth groove 224 and the second limiting washer 271 are used together on this side, so that even if the other side tilts upwards, the second screw 2121 does not push the fourth screw 27. Therefore, even if an incorrect mounting manner is used, the heat sink base 22 can be mounted to the lining board 211.

Optionally, the fastening assembly 21 includes a lining board 211 that is disposed on an upper surface of the PCB 3 and that is located outside the processor slot 31, and a midplane 212 that is disposed on a lower surface of the PCB 3 and that is located on a rear surface of the processor slot 31, a second screw 2121 fitting the limiting mechanical part is disposed on the midplane 212, a fourth limiting hole 2112 is provided on the lining board, and the second screw 2121 passes through the PCB 3 and the fourth limiting hole 2112 to limit the lining board 211 to a position. The lining board 211 is disposed along an edge of the processor slot 31, to ensure that the processor 4 can be smoothly put in place after mounting is complete. The second screw 2121 can fit the limiting mechanical part, in other words, may be the foregoing second screw 2121 that fits the first screw 24, or may be a nut or a screw that fits the third screw 25.

Optionally, a heat sink 5 is fastened on the heat sink base 22. The heat sink 5 may use a passive heat dissipation design, for example, as shown in a heat sink structure in FIG. 3, heat sink fins and a heat dissipation duct 228 that is disposed on the heat sink base 22 are used to passively dissipate heat; or may use an air-cooled heat dissipation manner, to be specific, based on passive heat dissipation, an air duct formed in a computer device and a cooling fan are used, so that heat can be quickly dissipated out of the computer device; or certainly, may use a water-cooled heat dissipation manner, to be specific, a water block is mounted on the heat sink base 22, and heat dissipating components are mounted inside or outside a shelf of a computer device, where the heat dissipating components are a metal duct and a cooling fan whose air flow direction corresponds to an air flow direction of the metal duct, the water block is connected to a duct, the duct forms circulation between the water block and the heat dissipating components, and the duct is filled with coolant.

Figure 7A:
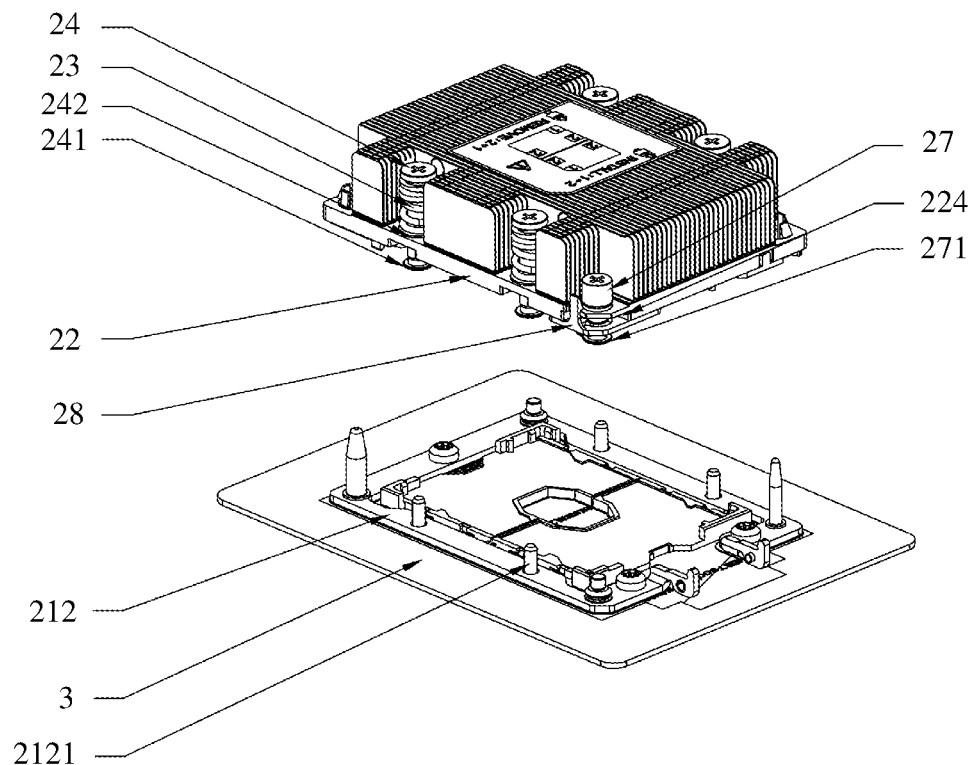
FIG. 7A is an embodiment diagram of a processor fastening structure according to an embodiment of this application.
Figure 7B:
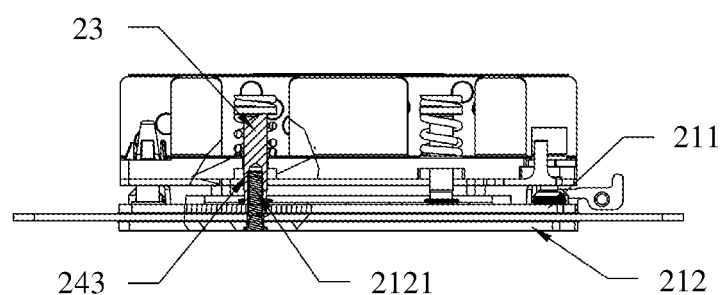
FIG. 7B is an embodiment diagram of a processor fastening structure according to an embodiment of this application.

The following describes a process of mounting the processor fastening structure. In this embodiment of this application, in the process of mounting the processor fastening structure, the lining board 211 is first fastened around the processor slot 31, the midplane is mounted on a rear surface of the PCB 3, and the second screw 2121 on the midplane 212 passes through the fourth limiting hole 2112 in the lining board 211. Then, the processor 4 is mounted on the cover 28, and the mounted structure is mounted to the heat sink base 22, and the heat sink base 22, the processor 4, and the cover 28 are correspondingly mounted to the lining board 211. During fastening, first, the fourth screw 27 is aligned with a screw or a nut located in a corresponding position on the lining board 211, and a clamped structure is aligned with a clamped structure located on the lining board 211, to preliminarily limit the heat sink base to a position. Then, the first screw 24 and the fourth screw 27 are pressed down and tightened to fasten the entire heat sink base 22 to the lining board 211, so that the entire processor fastening structure is mounted. After mounting is complete, as shown in FIG. 7A and FIG. 7B, FIG. 7A is an embodiment diagram of a processor fastening structure according to an embodiment of this application, and FIG. 7B is an embodiment diagram of a processor fastening structure according to an embodiment of this application. It can be learned that in FIG. 7A, the compression spring 23 is in a compressed state and provides elastic force for the head end of the first screw 24 and the heat sink base 22. A magnitude of the elastic force is related to a compression degree of the compression spring 23. When the compression spring 23 is compressed to be shorter, the elastic force provided for the head end of the first screw 24 and the heat sink base 22 is larger, and this is equivalent to that down force on the heat sink base 22 is larger, and pressure from the heat sink base 22 to the processor is larger. It can be learned from FIG. 7B that the second screw 2121 is almost completely tightened into the inner threads 243 of the first screw 24, and in this case, elastic force of the compression spring 23 reaches a maximum value. In addition, because the second screw 2121 is disposed on the midplane 212, when the first screw 24 is tightened, the midplane 212, the lining board 211, and the heat sink base 22 are fastened more tightly, and strength of a processor area can be enhanced.

Embodiment 3

Figure 8A:
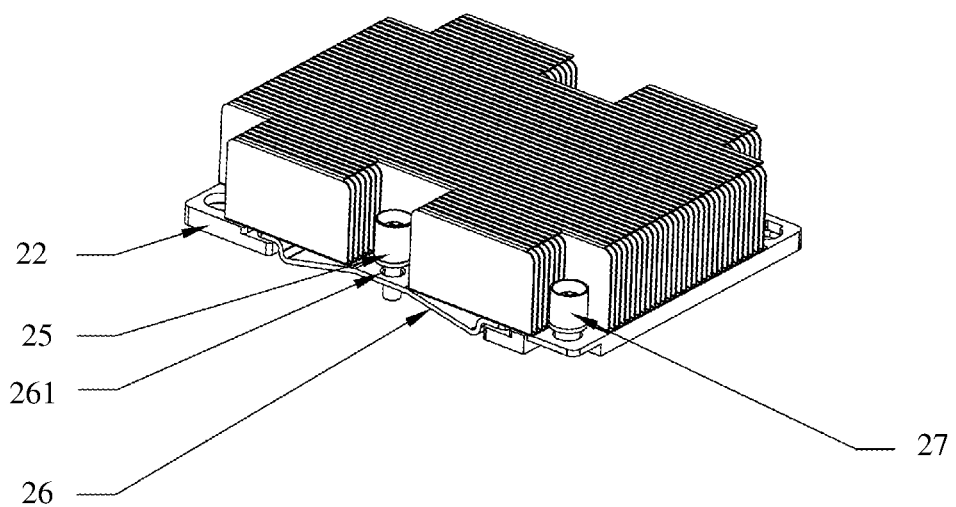
FIG. 8A is an embodiment diagram of a processor fastening structure according to an embodiment of this application.
Figure 8B:
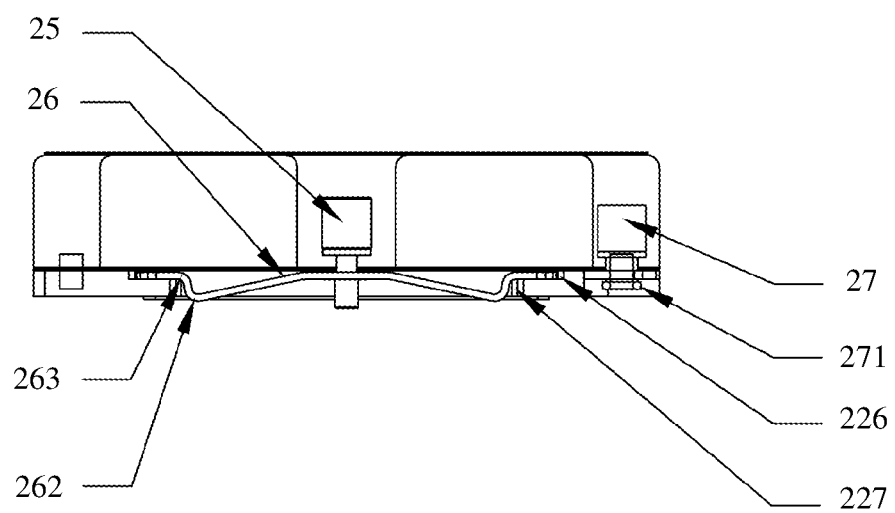
FIG. 8B is an embodiment diagram of a processor fastening structure according to an embodiment of this application.

In this embodiment, based on Embodiment 1, FIG. 8A is an embodiment diagram of a processor fastening structure according to an embodiment of this application, and FIG. 8B is an embodiment diagram of a processor fastening structure according to an embodiment of this application. The limiting mechanical part is a third screw 25, the elastic mechanical part is a spring plate 26, a second limiting hole 261 is provided on a curved part in a middle part of the spring plate 26, an inner side of the curved part is opposite the heat sink base 22, the third screw 25 passes through the second limiting hole 261 to connect to the heat sink base 22, an outer diameter of a head part of the third screw 25 is greater than an diameter of the second limiting hole 261, and two ends of the spring plate 26 are separately connected to the heat sink base 22. In this case, the elastic mechanical part is the spring plate 26 that is curved in the middle, the inner side of the curved part is opposite the heat sink base 22, and the diameter of the second limiting hole 261 is less than the outer diameter of the head end of the third screw 25. Therefore, when the third screw 25 in the curved part shortens a distance between the head part of the third screw 25 and the heat sink base 22, the two ends of the spring plate 26 generate down force on the heat sink base 22.

Optionally, a second groove 226 corresponding to the spring plate and a third groove 227 located at the bottom of the second groove 226 are disposed on the heat sink base 22, a first curved part 262 and a second curved part 263 are disposed at a tail end of the spring plate 26, the first curved part 262 is located in the third groove 227, and the second curved part 263 is located at a joint that is of the second groove 226 and that is between the second groove 226 and the third groove 227. In this case, the third groove 227 is provided at the bottom of the second groove 226, the second groove 226 and edges of the third groove 227 form a staircase structure, the first curved part 262 and the second curved part 263 are separately disposed at the two ends of the spring plate 26, the first curved part 262 is located in the third groove 227, and the second curved part 263 is located at a joint that is of the second groove 226 and that is between the second groove 226 and the third groove 227. Therefore, in this structure, the third groove 227 is used to provide specific deformation space for the spring plate 26, and when the spring plate 26 is deformed under pressure, the second curved part 263 generates pressure on the bottom of the second groove 226.

It should be noted that the third limiting holes 223 located on the sides of the heat sink base 22 and provided in the opposite corners, the fourth screws 27, the second limiting washers 271 on the fourth screws 27, the fourth grooves 224, and the clamped structure located in the other corner of the heat sink base 22 are similar to corresponding structures in Embodiment 1. For detailed description, refer to related description in Embodiment 1. Details are not described herein again.

The following describes a process of mounting the processor fastening structure. In this embodiment of this application, in the process of mounting the processor fastening structure, the lining board 211 is first fastened around the processor slot 31, the midplane 212 is mounted on a rear surface of the PCB 3, and the second screw 2121 on the midplane 212 passes through the fourth limiting hole 2112 in the lining board 211. Then, the processor 4 is mounted on the cover 28, and the mounted structure is mounted to the heat sink base 22, and the heat sink base 22, the processor 4, and the cover 28 are correspondingly mounted to the lining board 211. During fastening, first, the fourth screw 27 is aligned with a screw or a nut located in a corresponding position on the lining board 211, and a clamped structure is aligned with a clamped structure located on the lining board 211, to preliminarily limit the heat sink base to a position. Then, the first screw 24 and the fourth screw 27 are pressed down and tightened to fasten the entire heat sink base 22 to the lining board 211, so that the entire processor fastening structure is mounted.

It should be noted that, because the spring plate 26 is used as the elastic mechanical part in this embodiment of this application, and the spring plate 26 has two ends, when pressure is applied to a middle part of the spring plate by using the third screw 25, the pressure is scattered to the two ends of the spring plate 26, in other words, this is equivalent to that the two ends of the spring plate 26 apply down force on the heat sink base 22. Because one spring plate 26 is disposed on each of the two sides of the heat sink base 22, elastic force generated by one spring plate 26 needs to reach elastic force of the two or three compression springs 23 in Embodiment 2, to be specific, the elastic force needs to reach 30 kgf to 45 kgf.

It should be noted that the compression springs 23 used in Embodiment 2 of this application may be used together with the spring plate 26 used in Embodiment 3 of this application. For example, two compression springs 23 are disposed on one side of the heat sink base 22, and one spring plate 26 having elastic force of two compression springs 23 is disposed on the other side. For another example, compression springs 23 are used on two opposite sides of the heat sink base 22, and spring plates 26 are used on the other two opposite sides of the heat sink base 22. Specifically, whether only compression springs 23 are used, only spring plates 26 are used, or both a compression spring 23 and a spring plate 26 are used may be determined based on a specific mounting environment. This is not limited herein.

An embodiment of this application further provides an assembly. The assembly includes a processor, a heat sink, and the processor fastening structure according to any one of Embodiment 1 to Embodiment 3.

Optionally, the processor may be an advanced reduced instruction set machine (Advanced RISC Machine (ARM)) processor.

This application provides a computer device. The computer device includes the foregoing processor and the foregoing processor fastening structure. The processor and the processor fastening structure are both the foregoing processor and the foregoing processor fastening structure in the embodiments of this application. For a connection relationship and a fastening relationship between the processor and the processor fastening structure, refer to the foregoing description.

Optionally, the computer device further includes a heat sink. The heat sink is the foregoing heat sink in the embodiments of this application. For a connection relationship and a fastening relationship between the heat sink and the processor fastening structure and a connection relationship and a fastening relationship between the heat sink and the processor, refer to the foregoing description.

Optionally, the computer device may be an x86 server. The processor of the computer device may be a processor supporting an x86 instruction set.

Optionally, the computer device may be an advanced reduced instruction set machine ARM server. The processor of the computer device may be an ARM processor.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

What is claimed is:

1. A mechanical part for fastening a processor on a printed circuit board (PCB), the mechanical part comprising:
   a heat sink base comprising a limiting hole;
   a fastening assembly comprising a lining board;
   a compression spring disposed on the heat sink base and comprising a compression spring inner diameter;
   a first via provided in the heat sink base;
   a first screw disposed on the heat sink base and comprising:
     a first screw tail end passing through the compression spring and the first via to connect to the fastening assembly, and
     a first screw head end comprising a first screw head end diameter that is greater than the compression spring inner diameter, wherein the compression spring is located between the first screw head end and the heat sink base;
   a cover configured to carry the processor and fasten the processor to the heat sink base; and
   a dowel disposed on the lining board and configured to pass through the cover and the limiting hole to limit the processor to a position.

2. The mechanical part of claim 1, wherein the fastening assembly is configured to connect to the printed circuit board, and wherein the mechanical part further comprises heat sink fins disposed on the heat sink base.

3. The mechanical part of claim 1, wherein the first via comprises a first via diameter, and wherein the compression spring further comprises a compression spring outer diameter that is greater than the first via diameter.

4. The mechanical part of claim 3, further comprising:
   a washer disposed between the compression spring and the heat sink base, wherein the washer is sheathed over the first screw, and wherein the washer comprises a washer diameter that is greater than the first via diameter; and
   a second via provided in the washer and comprising a second via diameter,
   wherein the compression spring outer diameter is greater than the second via diameter.

5. The mechanical part of claim 4, wherein the first screw tail end comprises a first screw tail end diameter that is greater than the first via diameter.

6. The mechanical part of claim 4, further comprising a first limiting washer disposed at the first screw tail end such that the heat sink base is located between the compression spring and the first limiting washer, wherein the first limiting washer is sheathed over the first screw, wherein the first screw tail end comprises a first screw tail end diameter, and wherein the first limiting washer comprises:
   a first limiting washer inner diameter that is less than the first screw tail end diameter; and
   a first limiting washer outer diameter that is greater than the first via diameter.

7. The mechanical part of claim 6, wherein the heat sink base comprises a surface, wherein the mechanical part further comprises a first groove provided on the surface, and wherein the first limiting washer is configured to be located in the first groove when the first limiting washer is in contact with the heat sink base.

8. The mechanical part of claim 1, further comprising:
a third via provided in the heat sink base and comprising a third via diameter; and
a fourth screw provided on the heat sink base and comprising:
a fourth screw tail end passing through the third via to connect to the fastening assembly, and
a fourth screw head end comprising a fourth screw head end diameter that is greater than the third via diameter.

9. The mechanical part of claim 8, further comprising a second limiting washer disposed at the fourth screw tail end such that the heat sink base is located between the fourth screw head end and the second limiting washer, wherein the second limiting washer is sheathed over the fourth screw, wherein the fourth screw tail end comprises a fourth screw tail end diameter, and wherein the second limiting washer comprises:
a second limiting washer inner diameter that is less than the fourth screw tail end diameter; and
a second limiting washer outer diameter that is greater than the third via diameter.

10. The mechanical part of claim 9, wherein the heat sink base comprises a surface, wherein the mechanical part further comprises a fourth groove provided on the surface, and wherein the second limiting washer is located in the fourth groove when the second limiting washer is in contact with the heat sink base.

11. The mechanical part of claim 1, further comprising a second screw disposed on the fastening assembly, wherein the first screw tail end comprises first screw inner threads, wherein the second screw comprises outer threads that fit the first screw inner threads, and wherein the first screw is connected to the fastening assembly using the second screw.

12. The mechanical part of claim 11, wherein the lining board is configured to be disposed on an upper surface of the printed circuit board, and wherein the fastening assembly further comprises:
a midplane configured to be disposed on a lower surface of the printed circuit board,
wherein the second screw is disposed on the midplane, and
wherein the second screw is configured to pass through the printed circuit board and the lining board to connect to the first screw.

13. The mechanical part of claim 12, further comprising a nut, wherein the midplane comprises a fastening screw configured to pass through the printed circuit board and the lining board in order to connect the lining board and the printed circuit board using the nut.

14. The mechanical part of claim 13, further comprising a fourth screw provided on the heat sink base and comprising a fourth screw tail end, wherein the fourth screw tail end comprises fourth screw inner threads, wherein the fastening screw comprises fastening screw outer threads that fit the fourth screw inner threads, and wherein the fourth screw is connected to the fastening assembly using the fastening screw.

15. The mechanical part of claim 1, further comprising:
at least one additional screw; and
at least one additional compression spring.

16. The mechanical part of claim 1, wherein a free height of the compression spring is less than a length of the first screw.

17. A processor assembly comprising:
a processor; and
a mechanical part for fastening the processor on a printed circuit board (PCB) and comprising:
a heat sink base comprising a limiting hole;
a fastening assembly comprising a lining board;
a compression spring disposed on the heat sink base and comprising a compression spring inner diameter;
a first via provided in the heat sink base;
a first screw disposed on the heat sink base and comprising:
a first screw tail end passing through the compression spring and the first via to connect to the fastening assembly,
a first screw head end comprising a first screw head end diameter that is greater than the compression spring inner diameter, wherein the compression spring is located between the first screw head end and the heat sink base;
a cover configured to carry the processor and fasten the processor to the heat sink base; and
a dowel disposed on the lining board and configured to pass through the cover and the limiting hole to limit the processor to a position.

18. A computer device comprising:
a processor assembly comprising:
a processor; and
a mechanical part for fastening the processor on a printed circuit board (PCB) and comprising:
a heat sink base comprising a limiting hole;
a fastening assembly comprising a lining board;
a compression spring disposed on the heat sink base and comprising a compression spring inner diameter;
a first via provided in the heat sink base;
a first screw disposed on the heat sink base and comprising:
a first screw tail end passing through the compression spring and the first via to connect to the fastening assembly, and
a first screw head end comprising a first screw head end diameter that is greater than the compression spring inner diameter, wherein the compression spring is located between the first screw head end and the heat sink base;
a cover configured to carry the processor and fasten the processor to the heat sink base; and
a dowel disposed on the lining board and configured to pass through the cover and the limiting hole to limit the processor to a position.

19. The computer device of claim 18, wherein the fastening assembly is configured to connect to the printed circuit board, and wherein the mechanical part further comprises heat sink fins disposed on the heat sink base.

20. The computer device of claim 18, wherein the first via comprises a first via diameter, and wherein the compression spring further comprises a compression spring outer diameter that is greater than the first via diameter.

* * * * *

UNITED STATES PATENT AND TRADEMARK OFFICE
CERTIFICATE OF CORRECTION

PATENT NO. : 11,133,239 B2  
APPLICATION NO. : 16/719030  
DATED : September 28, 2021  
INVENTOR(S) : Yonghai Mao et al.

Page 1 of 1

It is certified that error appears in the above-identified patent and that said Letters Patent is hereby corrected as shown below:

On the Title Page

Item (56) page 2, References Cited, U.S. Patent Documents: "2017/0034952 A1 02/2017 Veh et al." should read "2017/0034952 A1 02/2017 Yeh et al."

Item (56) page 2, References Cited, U.S. Patent Documents: "2020/0328135 A1 10/2020 Terhune, IV" should read "2020/0328135 A1 10/2020 Harvey Terhune, IV"

Signed and Sealed this  
Thirtieth Day of November, 2021

Drew Hirshfeld  
*Performing the Functions and Duties of the*  
*Under Secretary of Commerce for Intellectual Property and*  
*Director of the United States Patent and Trademark Office*